United States Patent [19]

Tanimoto et al.

[11] Patent Number: 5,453,709
[45] Date of Patent: Sep. 26, 1995

[54] CONSTANT CMOS DELAY CIRCUIT

[75] Inventors: Junichi Tanimoto, Ikoma; Toshiji Ishii, Sakurai, both of Japan

[73] Assignee: Sharp Shabushiki Kaisha, Osaka, Japan

[21] Appl. No.: 236,132

[22] Filed: May 2, 1994

[30] Foreign Application Priority Data

Jul. 20, 1993 [JP] Japan .................................. 5-179052

[51] Int. Cl.⁶ .............................. H03K 5/13; H03K 5/14
[52] U.S. Cl. ........................ 327/276; 327/277; 327/278; 327/281; 327/362; 327/262
[58] Field of Search ..................... 327/276, 277, 327/278, 281, 362, 513, 262

[56] References Cited

U.S. PATENT DOCUMENTS

| | | | |
|---|---|---|---|
| 4,806,804 | 2/1989 | O'Leary | 307/605 |
| 5,012,141 | 4/1991 | Tomisawa | 307/594 |
| 5,081,380 | 1/1992 | Chen | 307/591 |
| 5,130,582 | 7/1992 | Ishihara et al. | 307/591 |
| 5,231,319 | 7/1993 | Crafts et al. | 307/603 |

FOREIGN PATENT DOCUMENTS 3-29411  2/1991  Japan .

*Primary Examiner*—Timothy P. Callahan
*Assistant Examiner*—Eunja Shin

[57] ABSTRACT

A delay circuit comprises first modified inverter circuits, a first compensating circuit, second modified inverter circuits and second compensating circuit. Each first modified inverter circuit is composed of a CMOS inverter and an additional NMOS transistor. The CMOS inverter has an NMOS and a PMOS transistor connected in complementary connection between a positive power supply and ground. The additional NMOS transistor controls the current from the first modified inverter circuit to the ground. The first compensating circuit is connected to the gate of each additional NMOS transistor to supply an output signal for compensating a change in characteristic of the additional NMOS transistors. Each second modified inverter circuit is composed of a CMOS inverter and an additional PMOS transistor. The additional PMOS transistor controls a current from the second modified inverter circuit to the positive power supply. The second compensating circuit is connected to the gate of each additional PMOS transistor to supply an output signal for compensating a change in characteristic of the additional PMOS transistors. The first modified inverter circuits and the second inverter circuits are connected to each other to provide an output signal from the delay circuit which is delayed relative to an input signal into the delay circuit. The delay circuit may have a constant delay time event with variations in MOS transistor characteristic (Vth) and in ambient temperature.

16 Claims, 12 Drawing Sheets

CONSTANT CMOS DELAY CIRCUIT

BACKGROUND OF THE INVENTION

1. Filed of the Invention

The present invention relates to a delay circuit built in a CMOS (Complementary Metal Oxide Semiconductor) integrated circuit and applied for example to a timing generating circuit.

2. Related Background Art

A conventional delay circuit employed in a timing generating circuit or the like is a circuit as shown in FIG. 12. The delay circuit is so arranged that there are a plurality of (four in FIG. 12) stages of inverter circuits, each of which is composed of a p-channel MOS (hereinafter referred to as PMOS) transistor (p 22 to p 25 in FIG. 12) and an n-channel MOS (hereinafter referred to as NMOS) transistor (n 22 to n 25 in FIG. 12) connected in complementary symmetry connection between a power-supply voltage Vcc and the ground GND. A delay time is defined as a time difference between times for which input voltage Vin and output voltage Vo reach a certain voltage (for example a half of Vcc), respectively.

FIGS. 13a, 13b and 13c show simulation results (waveforms of Vin·Va·Vb·Vc·Vo in the drawings) using the delay circuit shown in FIG. 12. FIG. 13a shows a simulation result for a case where the ambient temperature Ta is a low temperature (LT) and a characteristic of the MOS transistors (i.e., Vth) is a min value (minimum value) on the process specification. FIG. 13b shows a simulation result for a case where the ambient temperature Ta is a room temperature (RT) and a characteristic of the MOS transistors (i.e., Vth) is the typical value (standard value) on the process specification. Similarly, FIG. 13c shows a simulation result for a case where the ambient temperature Ta is a high temperature (HT) and a characteristic of the MOS transistors (Vth) is the max value (maximum value) on the process specification.

As shown in FIGS. 13a–13c, the delay time of this circuit is a summation of delay times of respective inverter circuits and is determined by the geometry of each MOS transistor and the number of inverter circuit stages.

In the conventional delay circuit as described above, however, each inverter circuit greatly changes its delay time when the characteristic of MOS transistors (i.e., Vth) or the ambient temperature changes, which results in largely changing the total delay time of the delay circuit.

Even if the circuit could be optimized by adjusting the geometry of each MOS transistor and the number of inverter circuit stages, the delay circuit still had a problem that it was impossible to keep a difference between the max value and the min value of delay time within about a double, as shown in FIG. 13a and FIG. 13c.

SUMMARY OF THE INVENTION

The present invention has been accomplished taking the above problem into account. It is an object of the present invention to provide a delay circuit in which a delay time of each inverter circuit is kept constant even with variations in the characteristic of MOS transistors (Vth) and in the ambient temperature, so that the delay time of the entire circuit is kept almost constant.

The above object of the present invention can be achieved by a delay circuit comprising:

a first modified inverter circuit comprising-a CMOS inverter and an additional NMOS transistor, the CMOS inverter having an NMOS transistor and a PMOS transistor connected in complementary connection between a positive power supply and the ground, and the additional NMOS transistor controlling a current from the first modified inverter circuit to the ground;

a first compensating circuit connected to a gate of the additional NMOS transistor and providing to the gate an output signal for compensating a change in characteristic of the additional NMOS transistor;

a second modified inverter circuit comprising a CMOS inverter and an additional PMOS transistor, the CMOS inverter having an NMOS transistor and a PMOS transistor connected in complementary connection between the positive power supply and the ground, and the additional PMOS transistor controlling a current from the second modified inverter circuit to the positive power supply; and a second compensating circuit connected to a gate of the additional PMOS transistor and providing to the gate an output signal for compensating a change in characteristic of the additional PMOS transistor;

wherein the first modified inverter circuit and the second inverter circuit are connected to each other so as to provide an output signal from the delay circuit which is delayed relative to an input signal into the delay circuit.

The change in characteristic of additional transistors is for example a change in on-impedance of transistor due to variations in process parameter or in temperature.

In an embodiment of the present invention, the second modified inverter circuit receives the input signal into the delay circuit and the first modified inverter circuit outputs the output signal from the delay circuit.

In another embodiment of the present invention, the first modified inverter circuit receives the input signal into the delay circuit and the second modified inverter circuit outputs the output signal from the delay circuit.

A delay circuit of the present invention may include a plurality of first modified inverter circuits and a plurality of second modified inverter circuits alternately connected to each other.

In an embodiment, the first modified inverter circuits are arranged in odd stages and the second modified inverter circuits in even stages with respect to the input terminal of the delay circuit.

In another embodiment, the second modified inverter circuits are arranged in odd stages and the first modified inverter circuits in even stages with respect to the input terminal of the delay circuit.

In an embodiment, the additional NMOS transistor is connected between the source of the NMOS transistor in the first modified inverter circuit and the ground. Also, the additional PMOS transistor is connected between the source of the PMOS transistor in the second modified inverter circuit and the positive power supply.

In another embodiment, the additional NMOS transistor is connected between the drain of the NMOS transistor in the first modified inverter circuit and the output node. Also, the additional PMOS transistor is connected between the drain of the PMOS transistor in the second modified inverter circuit and the output node.

The first compensating circuit comprises an NMOS transistor and a resistor, the resistor being connected to the positive power supply at one end and to the drain of the NMOS transistor at the other end, and the source of the NMOS transistor being connected to the ground, wherein the first compensating circuit outputs the output signal from a connection point between the NMOS transistor and the resistor. The second compensating circuit comprises a PMOS transistor and a resistor, the resistor being connected to the ground at one end and to the drain of the PMOS transistor at the other end, and the source of the PMOS transistor being connected to the positive power supply, wherein the second compensating circuit outputs the output signal from a connection point between the PMOS transistor and the resistor.

In an embodiment, the first modified inverter circuit further comprises an additional PMOS transistor for controlling a current from the first modified inverter circuit to the positive power source, the additional PMOS transistor being connected to the second compensating circuit to receive an output signal therefrom, and the second modified inverter circuit further comprises an additional NMOS transistor for controlling a current from the second modified inverter circuit to the ground, the additional NMOS transistor being connected to the first compensating circuit to receive an output signal therefrom.

The output signal from the first compensating circuit becomes lower, if the threshold value Vtn of NMOS transistor is smaller than the standard value. This causes a decrease in on-impedance due to the lowered Vtn of NMOS transistor to cancel an increase in on-impedance due to the reduction in gate voltage, which permits the delay time of the first modified inverter circuit to be kept unchanged at that for Vtn of standard value. In case Vtn is greater than the standard value, an increase in on-impedance due to increased Vtn of NMOS transistor cancels a decrease in on-impedance due to a rise in gate voltage, whereby the delay time of the first modified inverter circuit is kept unchanged at that for Vtn of standard value.

If the ambient temperature is a low temperature, a decrease in on-impedance of NMOS transistor cancels an increase in on-impedance due to the lowered output signal from the first compensating circuit, which is supplied as the gate signal. If the ambient temperature is a high temperature, an increase in on-impedance of NMOS transistor cancels a decrease in on-impedance due to the increased level of gate signal. Accordingly, the delay time of the first modified inverter circuit is kept unchanged at that for the room temperature.

As for the second modified inverter circuit, the potential of output signal from the second compensating circuit increases, if the threshold value Vtp of PMOS transistor is lowered. A decrease in on-impedance due to the lowered Vtp of PMOS transistor cancels an increase in on-impedance due to a rise in gate voltage, which keeps the delay time unchanged at that for Vtp of standard value. Also, if Vtp is high, an increase in on-impedance due to the high Vtp cancels a decrease in on-impedance due to the lowered gate voltage, whereby the delay time of the second modified inverter circuit is kept unchanged at that for Vtp of standard value.

If the ambient temperature is a low temperature, a decrease in on-impedance of PMOS transistor cancels an increase in on-impedance due to an increased output voltage of the second compensating circuit, which is supplied as the gate signal. If the ambient temperature is a high temperature, an increase in on-impedance of PMOS transistor cancels a decrease in on-impedance due to the lowered gate signal. Accordingly, the delay time of the second modified inverter circuit is kept unchanged at that for the room temperature.

As described above, the delay circuit of the present invention can have the delay time kept constant even with variations in process parameter or in temperature.

Further objects and advantages of the present invention will be apparent from the following description of the preferred embodiments of the invention as illustrated in the accompanying drawings.

BRIEF DESCRIPTION OF THE DRAWINGS

FIGS. 6a–6c are drawings to show simulation results of delay time for the delay circuit shown in FIG. 1, in which FIG. 6a shows a simulation result for a case where the ambient temperature is a low temperature and the MOS transistor characteristic (Vth) is the min value, FIG. 6b a simulation result for a case where the ambient temperature is the room temperature and the MOS transistor characteristic (Vth) is the typical value, and FIG. 6c a simulation result for a case where the ambient temperature is a high temperature and the MOS transistor characteristic (Vth) is the max value;

DESCRIPTION OF THE PREFERRED EMBODIMENTS

Presently preferred embodiments of the present invention will be described in detail with reference to the accompanying drawings.

Figure 1:
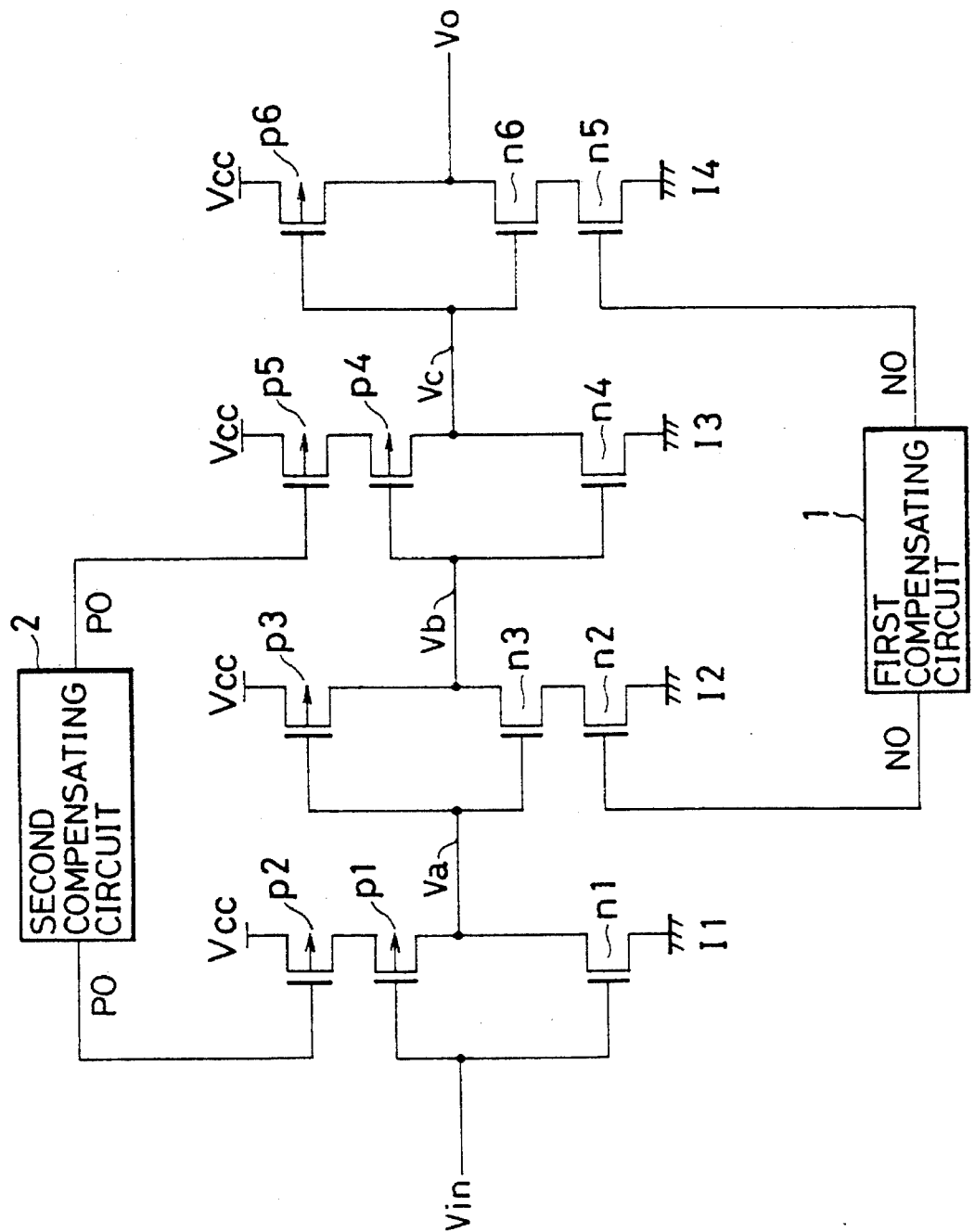
FIG. 1 is a circuit diagram to show a delay circuit in an embodiment according to the present invention.
Figure 12:
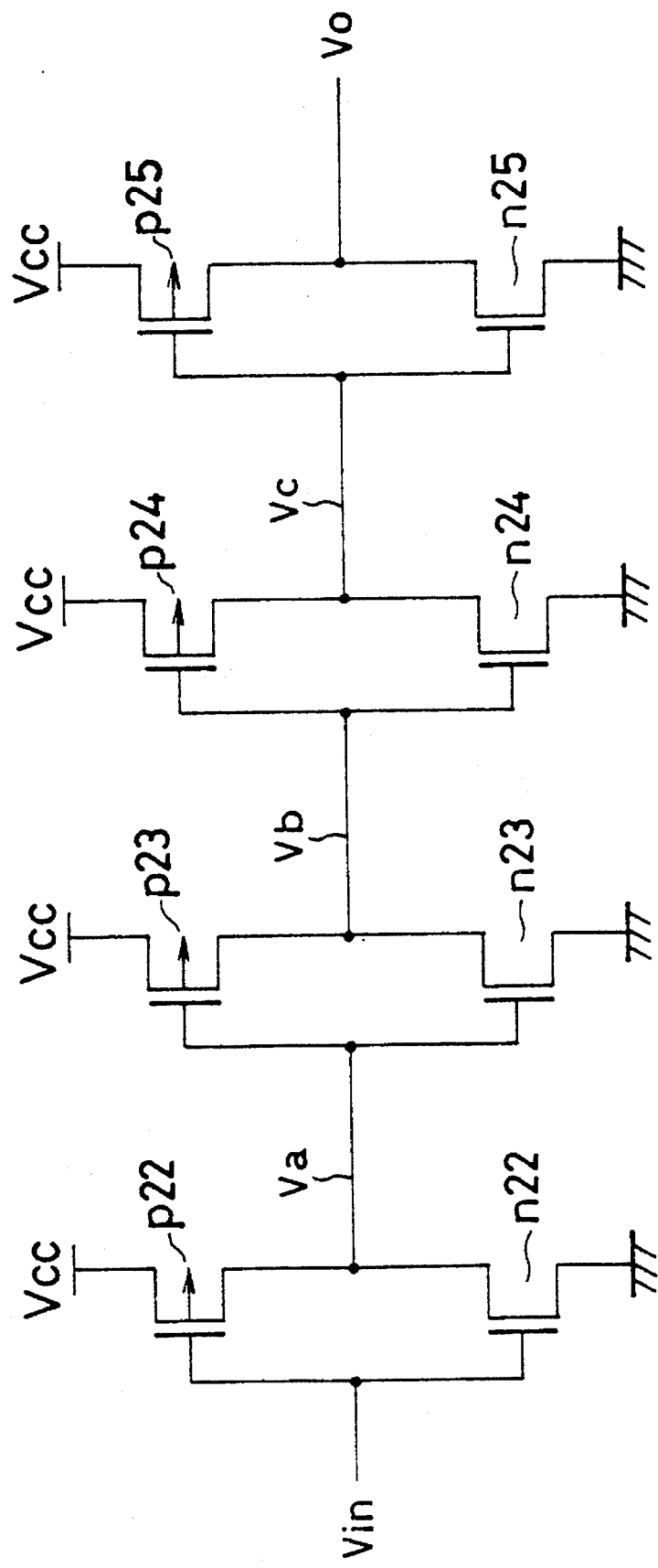
FIG. 12 is a circuit diagram to show a conventional delay circuit.
Figure 13A:
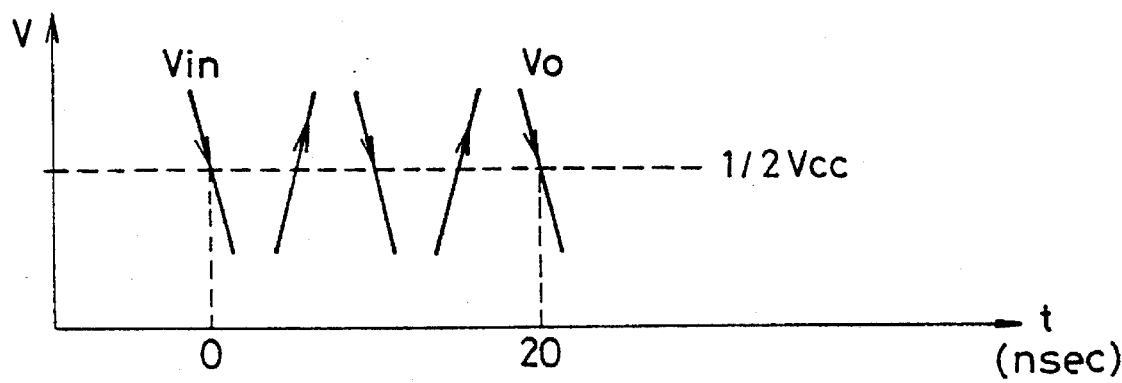
FIGS. 13a–13c are drawings to show simulation results of delay time for the conventional delay circuit shown in FIG. 12 against variations in MOS transistor characteristic (Vth) and in ambient temperature.
Figure 13B:
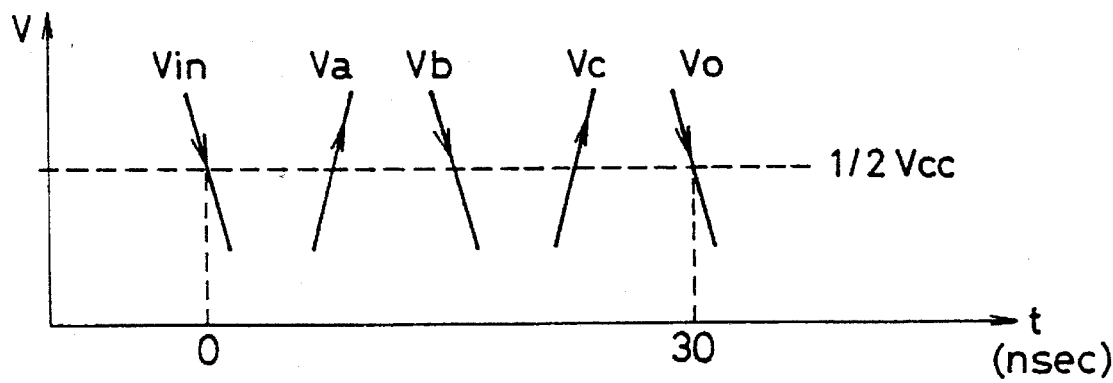
Figure 13C:
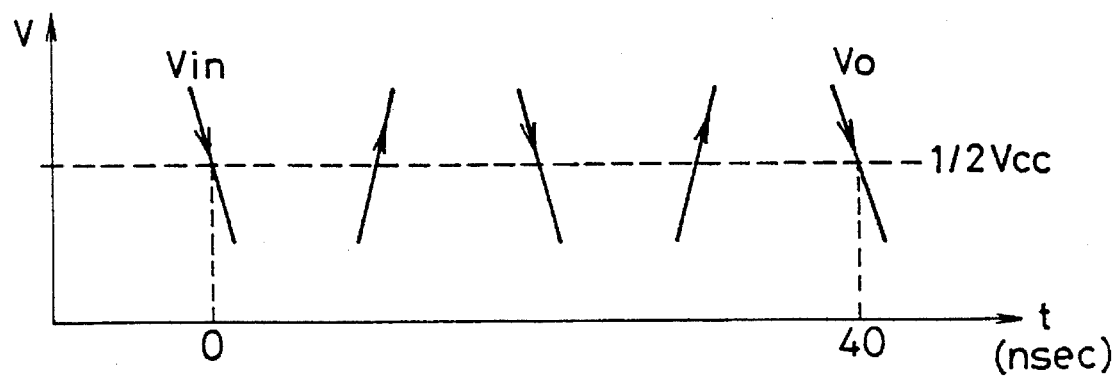

FIG. 1 shows a delay circuit mainly for producing a desired delay time when an input signal (Vin in FIG. 1) changes from the High level to the Low level. The delay circuit is composed of a first compensating circuit 1 for NMOS transistors, a second compensating circuit 2 for PMOS transistors, and four inverter stages, even stages of which are first modified inverter circuits I2 and I4 and odd stages of which are second modified inverter circuits I1 and I3. The first modified inverter circuit I2, I4 includes an NMOS transistor n2, n5 receiving a gate signal of an output signal NO from the first compensating circuit 1 and connected in series to the source of NMOS transistor n3, n6 in an ordinary inverter circuit. Also, the second modified inverter circuit I1, I3 includes a PMOS transistor p2, p5 receiving a gate signal of an output signal PO from the second compensating circuit 2 and connected in series to the source of PMOS transistor p1, p4 in an ordinary inverter circuit. The ordinary inverter circuits have the structure as shown in FIG. 12.

Figure 2:
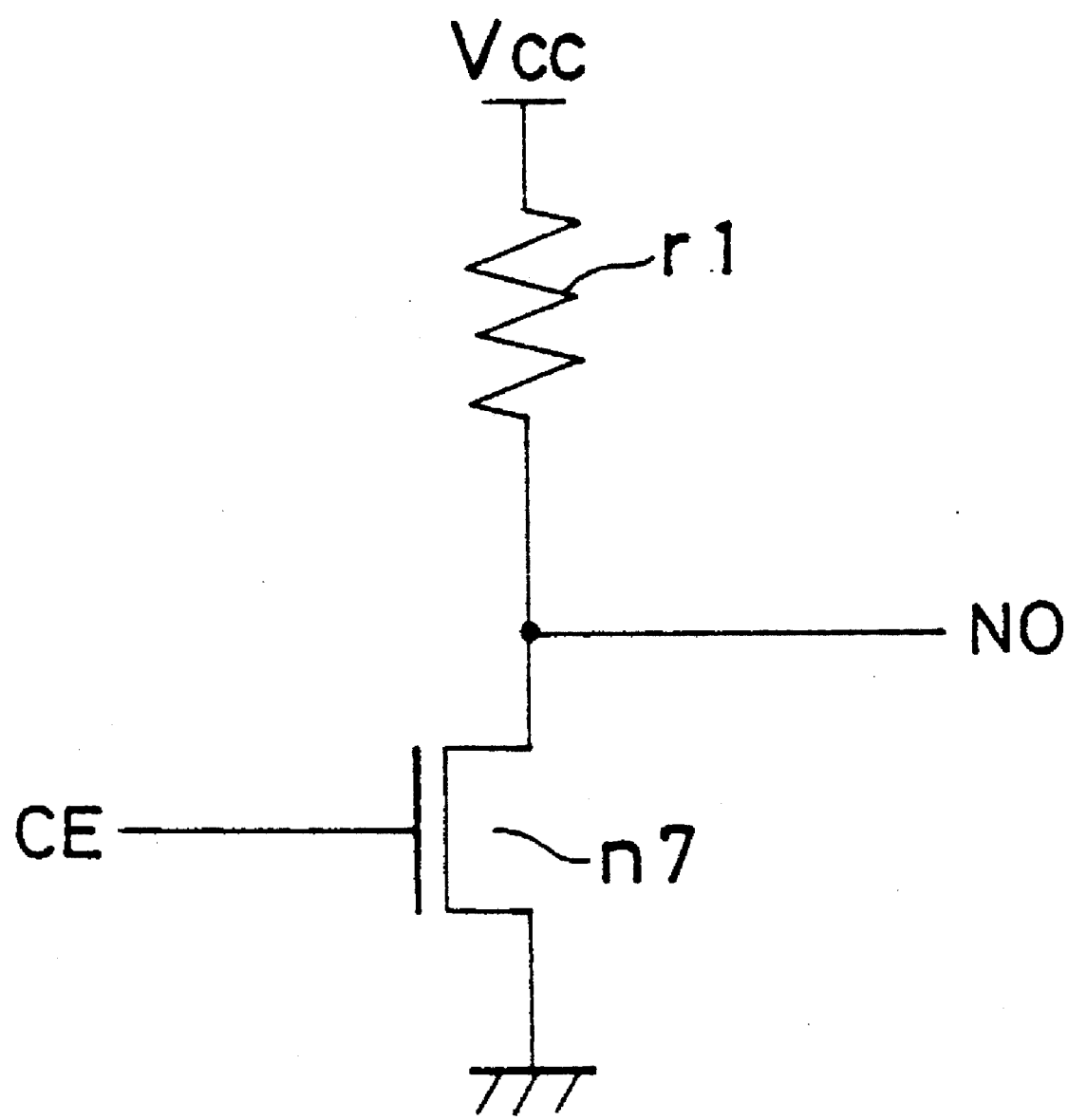
FIG. 2 is a circuit diagram to show a first compensating circuit for NMOS transistors.
Figure 3A:
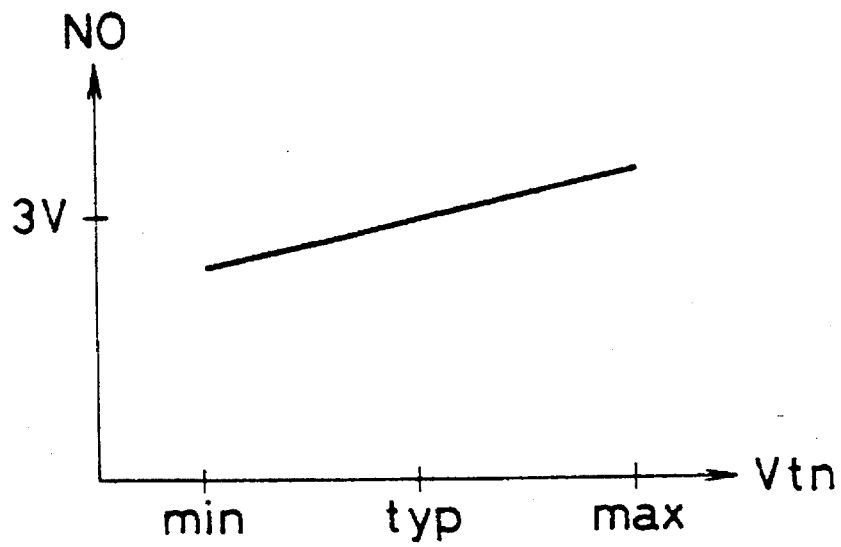
FIG. 3a and FIG. 3b are drawings to show simulation results for the first compensating circuit shown in FIG. 2, providing a change in output potential with a change in MOS transistor characteristic (Vth) or in ambient temperature, respectively.

FIG. 2 is a circuit diagram to show a first compensating circuit 1 for NMOS transistors. The first compensating circuit is composed of a resistor r1 and an NMOS transistor n7 connected in series between the power-source voltage Vcc and the ground GND. An output signal NO (normally a potential of about 3V) is supplied from the connection point between the resistor r1 and the transistor n7. The gate signal CE (chip enable) of NMOS transistor n7 is the power-source voltage Vcc in operation but the ground GND in stand-by. Therefore, the above-described first compensating circuit 1 consumes no power in stand-by. FIG. 3a shows a potential change in output signal NO from the first compensating circuit 1 shown in FIG. 2 against a change in NMOS transistor characteristic (Vtn) within the range on the process specification. As Vtn decreases, the on-impedance of NMOS transistor n7 becomes smaller, resulting in lowering the potential of output signal NO. Conversely, as Vtn increases, the on-impedance of NMOS transistor n7 becomes larger, resulting in increasing the potential of output signal NO.

Figure 3B:
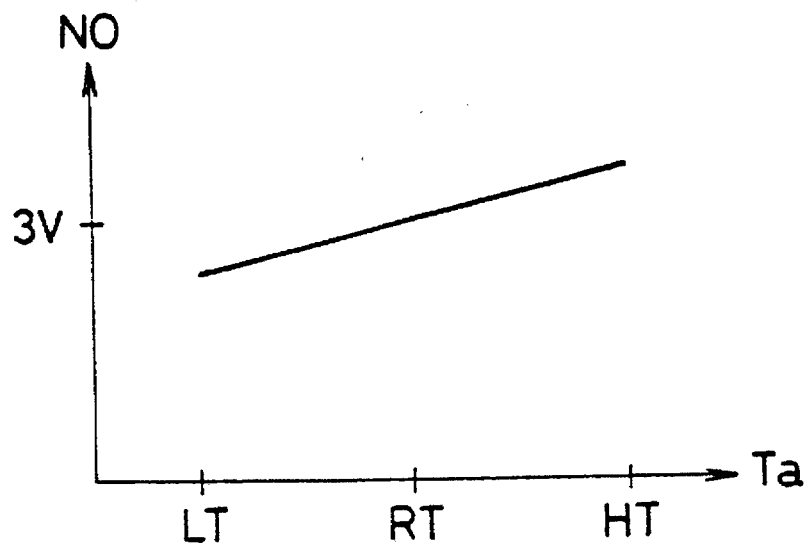

FIG. 3b shows a change in potential of output signal NO from the first compensating circuit 1 shown in FIG. 2 against a change in ambient temperature Ta. The resistance of resistor r1 and the on-impedance of NMOS transistor n7 both have positive dependency on the ambient temperature. The on-impedance of NMOS transistor n7 has far greater temperature dependency. Thus, if the ambient temperature Ta is a low temperature (LT), the on-impedance of NMOS transistor n7 decreases so as to lower the potential of output signal NO. If the ambient temperature Ta is a high temperature (HT), the on-impedance of NMOS transistor n7 increases so as to increase the potential of output signal NO.

Figure 4:
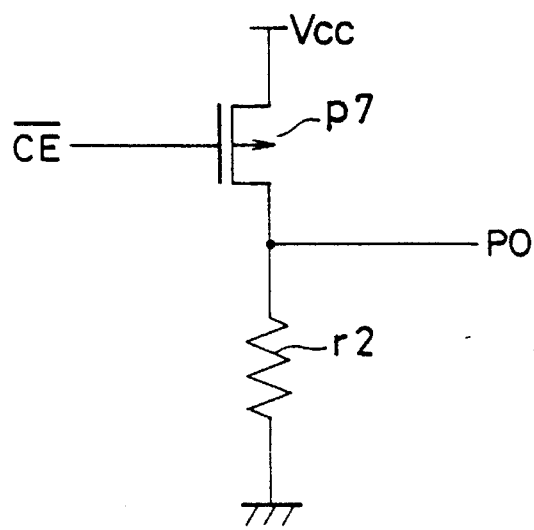
FIG. 4 is a circuit diagram to show a second compensating circuit for PMOS transistors.
Figure 5A:
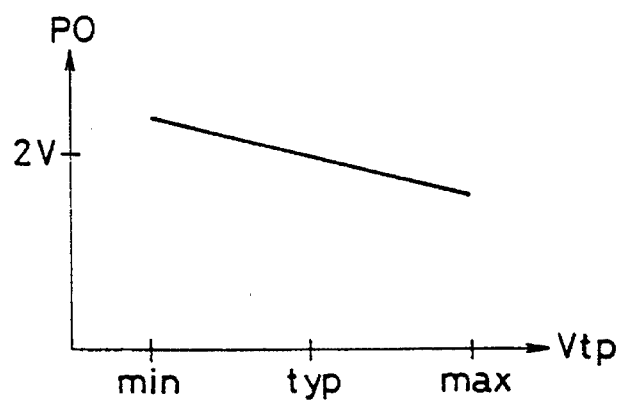
FIG. 5a And FIG. 5b are drawings to show simulation results for the second compensating circuit shown in FIG. 4, providing a change in output voltage with a change in MOS transistor characteristic (Vth) or in ambient temperature, respectively.
Figure 5B:
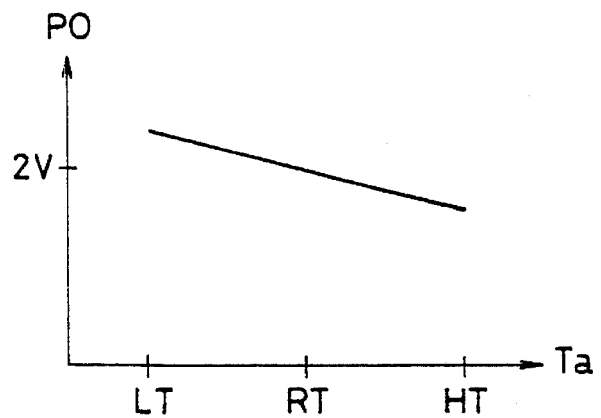

FIG. 4 is a circuit diagram to show a second compensating circuit 2 for PMOS transistors. The second compensating circuit 2 is composed of a PMOS transistor p7 and a resistor r2 connected in series between the power-source voltage Vcc and the ground GND. An output signal PO (normally a potential of about 2 V) is supplied from the connection point between the transistor p7 and the resistor r2. The gate signal CE (chip enable) of PMOS transistor p7 is the ground GND in operation but the power source voltage Vcc in stand-by. Consequently, the second compensating circuit 2 as described consumes no power in stand-by. FIG. 5a shows a change in potential of output signal PO from the second compensating circuit 2 shown in FIG. 4 against a change in PMOS transistor characteristic (Vtp) in the range on the process specification. As Vtp decreases, the on-impedance of PMOS transistor p7 decreases so as to increase the potential of output signal PO. Conversely, as Vtp increases, the on-impedance of PMOS transistor p7 increases so as to decrease the potential of output signal PO. FIG. 5b shows a change in potential of output signal PO from the second compensating circuit 2 shown in FIG. 4 against a change in ambient temperature Ta. The resistance of resistor r2 and the on-impedance of PMOS transistor p7 both have positive dependency on the ambient temperature. The on-impedance of PMOS transistor p7 has far greater temperature dependency. Thus, if the ambient temperature Ta is a low temperature (LT), the on-impedance of PMOS transistor p7 decreases so as to increase the potential of output signal PO. If the ambient temperature Ta is a high temperature (HT), the on-impedance of PMOS transistor p7 increases so as to decrease the potential of output signal PO.

Next described is the operation of the first modified inverter circuits I2 and I4 with variations in NMOS transistor characteristic (Vtn) and in ambient temperature. In FIG. 1, an input signal (Va and Vc in FIG. 1) into each of the first modified inverter circuits I2 and I4 is changed from the Low level to the High level. The geometry of NMOS transistors n2 and n5 and the potential of output signal from the first compensating circuit 1 are so arranged that the NMOS transistors n2 and n5 determine current values which the first modified inverter circuits I2 and I4 let to flow upon the level change. Here, since, in case of Vtn being smaller, the potential of output signal NO from the first compensating circuit 1 becomes lowered as described above, a decrease in on-impedance due to the lowered Vtn of NMOS transistors n2, n5 cancels an increase in on-impedance due to the lowered gate voltage, whereby a delay time of each first modified inverter circuit I2, I4 is kept nearly unchanged at a value for Vtn being the typical value. Also, if Vtn is larger, an increase in on-impedance due to the increased Vtn of NMOS transistors n2, n5 cancels a decrease in on-impedance due to the increased gate voltage, whereby a delay time of each first modified inverter circuit I2, I4 is kept nearly unchanged at the value for Vtn being the typical value. Consequently, the delay time in the first modified inverter circuits is kept almost unchanged in the range between the low Vtn and the high Vtn.

If the ambient temperature Ta is the low temperature (LT), a decrease in on-impedance of NMOS transistors n2 and n5 cancels an increase in on-impedance due to the lowered output signal NO from the first compensating circuit 1 as the gate signal. If the ambient temperature Ta is the high temperature (HT), an increase in on-impedance of NMOS transistors n2 and n5 cancels a decrease in on-impedance due to the increased gate signal. Consequently, the delay time in the first modified inverter circuits I2, I4 is kept almost unchanged in the range between the low ambient temperature and the high ambient temperature.

Next described is the operation of the second modified inverter circuits I1 and I8 with variations in PMOS transistor characteristic (Vtp) and in ambient temperature. In FIG. 1, an input signal (Vin and Vb in FIG. 1) of each second modified inverter circuit I1, I8 is changed from the High level to the Low level. The geometry of PMOS transistors p2, p5 and the potential of output signal from the second compensating circuit 2 are so arranged that the PMOS transistors p2 and p5 determine current values which the second modified inverter circuits I1 and I3 let to flow to the power supply voltage Vcc upon the level change. Here, since, in case of Vtp being smaller, the potential of output signal PO from the second compensating circuit 2 becomes increased as described above, a decrease in on-impedance due to the decreased Vtp of PMOS transistors p2 and p5 cancels an increase in on-impedance due to an increase in gate voltage, whereby a delay time of each second modified inverter circuit I1, I3 is kept almost unchanged at the value for Vtp being the typical value. Also, if Vtp is larger, an increase in on-impedance due to the increased Vtp of PMOS transistors p2, p5 cancels a decrease in on-impedance due to a decrease in gate voltage, whereby a delay time of each second modified inverter circuit I1, I3 is kept almost unchanged at the value for Vtp being the typical value. Consequently, the delay time in the second modified inverter circuits is kept almost unchanged in the range between the low Vtp and the high Vtp.

Also, if the ambient temperature Ta is the low temperature (LT), a decrease in on-impedance of PMOS transistors p2, p3 cancels an increase in on-impedance due to an increase in output signal PO as the gate signal from the second compensating circuit 2. If the ambient temperature Ta is the high temperature (HT), an increase in on-impedance of PMOS transistors p2, p5 cancels a decrease in on-impedance due to a decrease in gate signal. Consequently, the delay time in the second modified inverter circuits I1, I3 is kept almost unchanged in the range between the low ambient temperature and the high ambient temperature.

As previously described, the delay time of the delay circuit shown in FIG. 1 is a summation of delay times by the first modified inverter circuits and the second modified inverter circuits. Therefore, the delay time of the delay circuit shown in FIG. 1 is kept almost constant even with variations in MOS transistor characteristic (Vth) and in ambient temperature.

Figure 6A:
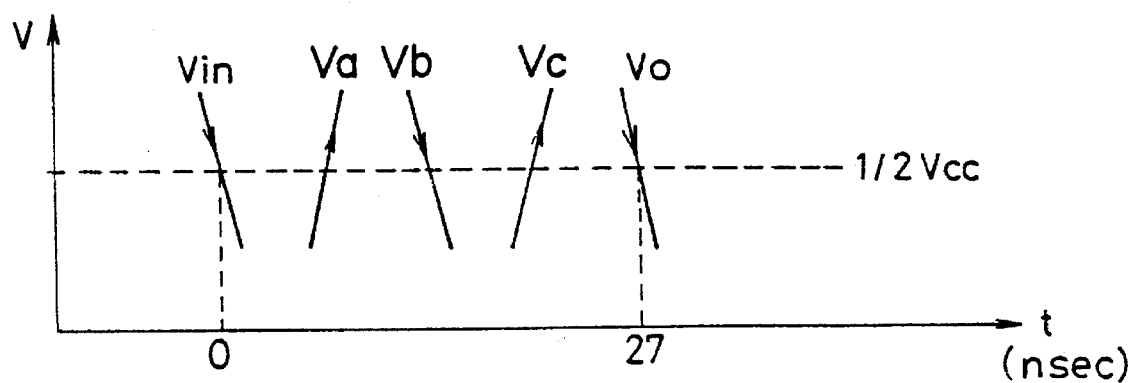
Figure 6B:
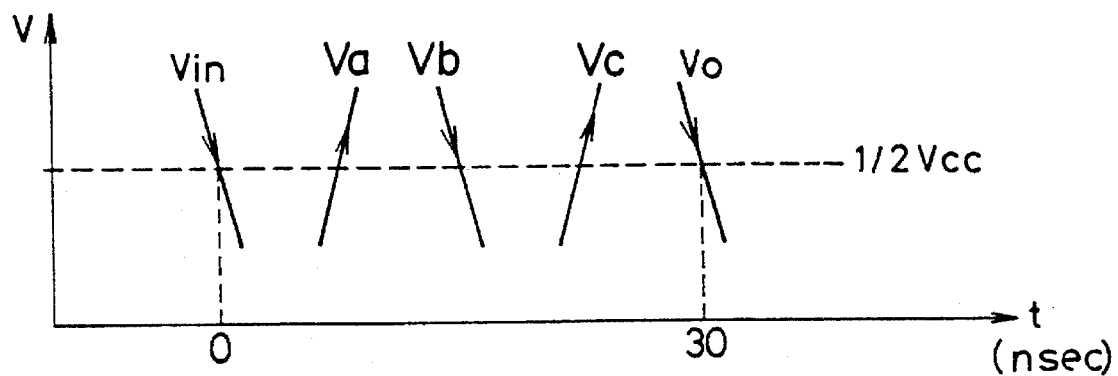
Figure 6C:
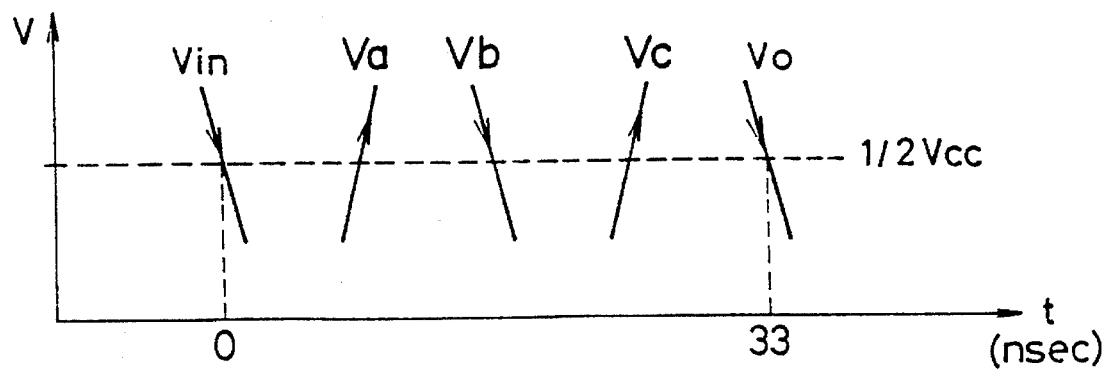

FIGS. 6a, 6b and 6c show simulation results (waveforms of Vin·Va·Vb·Vc·Vo in the drawings) for the delay circuit shown in FIG. 1, in which a dispersion of delay time is set to about 1.2 times with variations in MOS transistor characteristic (Vth) and in ambient temperature. FIG. 6a shows a simulation result for a case where the ambient temperature Ta is the low temperature (LT) and the MOS transistor characteristic (Vth) is the min value on the process specification. FIG. 6b shows a simulation result for a case where the ambient temperature Ta is the room temperature (RT) and the MOS transistor characteristic (Vth) is the typical value on the process specification. Similarly, FIG. 6c shows a simulation result for a case where the ambient temperature Ta is the high temperature (HT) and the MOS transistor characteristic (Vth) is the max value on the process specification.

Figure 7:
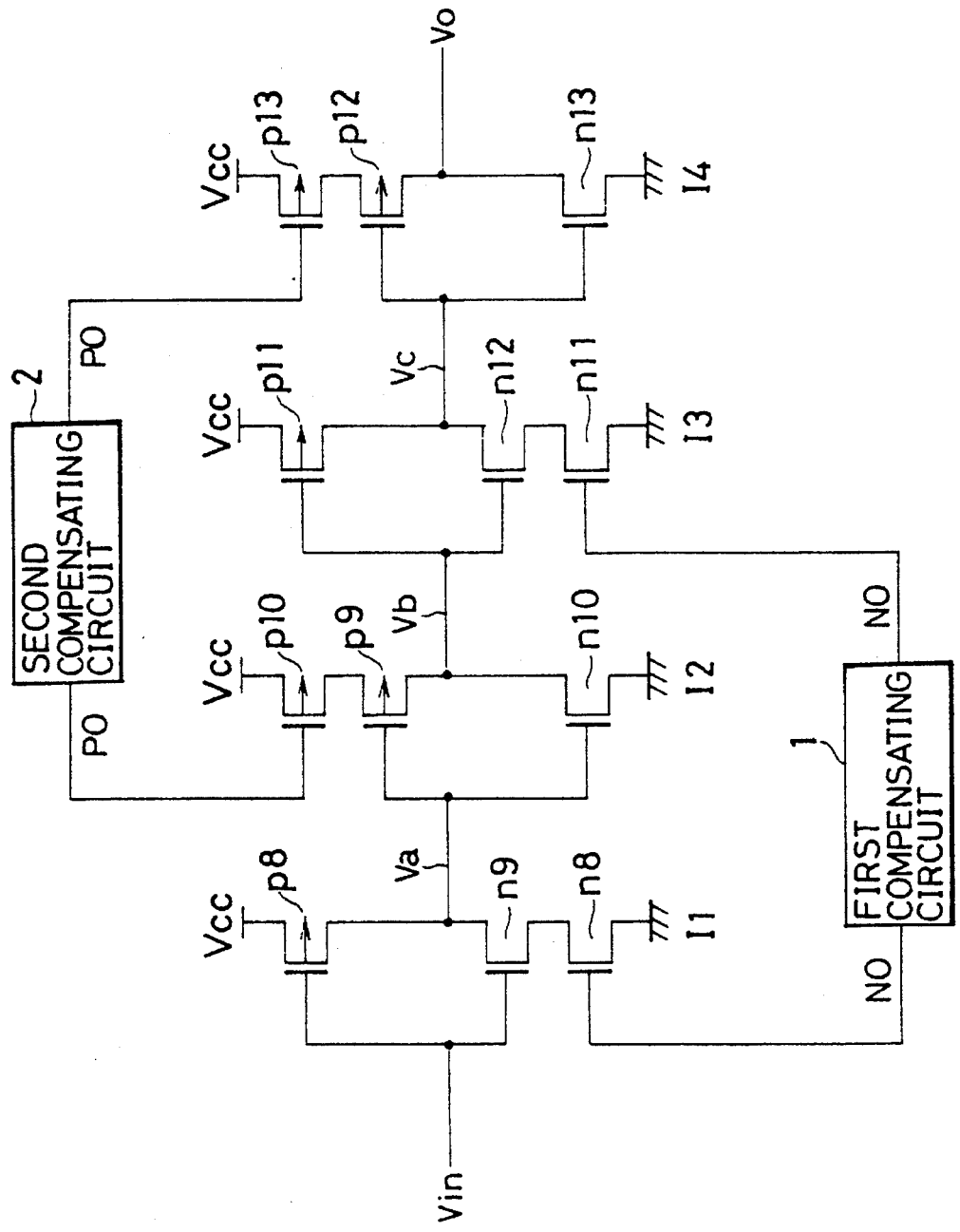
FIG. 7 is a circuit diagram to show a delay circuit in another embodiment according to the present invention.

FIG. 7 shows another embodiment of the present invention, which is a delay circuit mainly for producing a desired delay time when the input signal (Vin in FIG. 7) is changed from the Low level to the High level.

The delay circuit is composed of a first compensating circuit 1 for NMOS transistors, a second compensating circuit 2 for PMOS transistors, and four inverter stages, odd stages of which are first modified inverter circuits I1 and I3 and even stages of which are second modified inverter circuits I2 and I4. In each first modified inverter circuit I1, I3, an NMOS transistor n8, n11 receiving an output signal NO from the first compensating circuit 1 as the gate signal is connected in series to the source of NMOS transistor n9, n12 in an ordinary inverter circuit as shown in FIG. 12. Also, in each second modified inverter circuit I2, I4, a PMOS transistor p10, p13 receiving an output signal PO from the second compensating circuit 2 as the gate signal is connected in series to the source of PMOS transistor p9, p12 in an ordinary inverter circuit as shown in FIG. 12.

This delay circuit can also obtain an almost constant delay time even with variations in MOS transistor characteristic (Vth) and in ambient temperature by properly setting the potential of output signals from the compensating circuits and the geometry of the MOS transistors receiving the respective output signals from the compensating circuits as gate signal.

Figure 8:
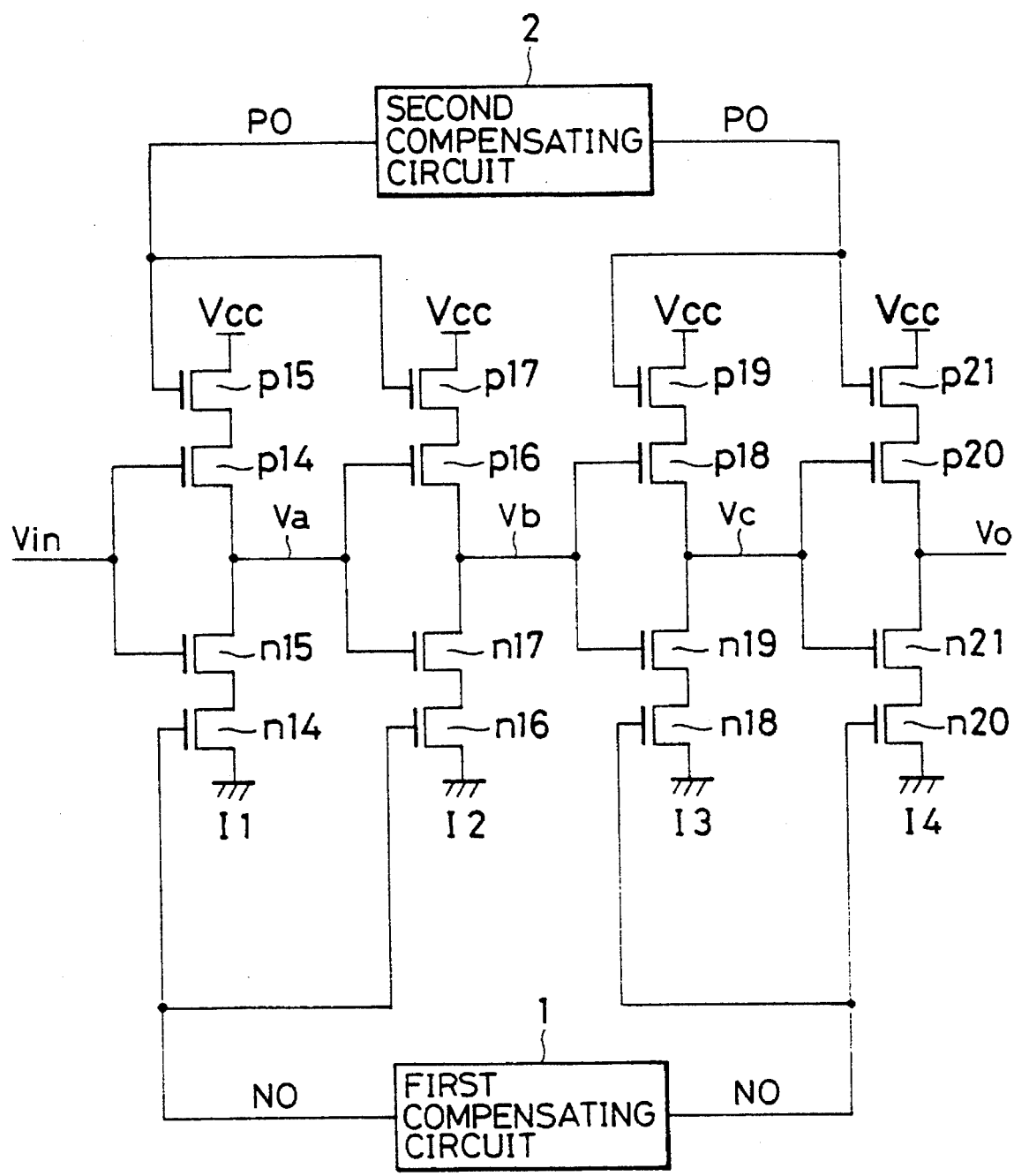
FIG. 8 is a circuit diagram to show a delay circuit in still another embodiment according to the present invention.

FIG. 8 shows still another embodiment of the present invention, which is a delay circuit for producing a desired delay time both for a case in which the input signal (Vin in FIG. 8) is changed from the Low level to the High level and for a case in which the input signal (Vin) is changed from the High level to the Low level.

The delay circuit is composed of a first compensating circuit 1 for NMOS transistors, a second compensating circuit 2 for PMOS transistors, and four inverter stages of modified inverter circuits I1, I2, I3, I4. In each modified inverter circuit I1, I2, I3, I4, a PMOS transistor p15, p17, p19, p21 receiving an output signal PO from the second compensating circuit 2 as gate signal is connected in series to the source of a PMOS transistor p14, p16, p18, p20 in an ordinary inverter circuit as shown in FIG. 12 and an NMOS transistor n14, n16, n18, n20 receiving an output signal NO from the first compensating circuit 1 as gate signal is connected in series to the source of an NMOS transistor n15, n17, n19, n21 in the ordinary inverter circuit.

This delay circuit can also obtain an almost constant delay time even with variations in MOS transistor characteristic (Vth) and in ambient temperature by properly setting the potential of output signals from the compensating circuits and the geometry of MOS transistors receiving the output signals as gate signal.

In the above embodiments, the resistors used in the first compensating circuit 1 and in the second compensating circuit 2 each have a resistance of about 2 k$\Omega$, which occupies a negligibly small area in the total chip area.

In the above embodiments, each additional NMOS transistor receiving the output signal from the first compensating circuit 1 is connected in series between the source of NMOS transistor in the ordinary inverter circuit and the ground while each additional PMOS transistor receiving the output signal from the second compensating circuit 2 is connected in series between the source of PMOS transistor in the ordinary inverter circuit and the positive power supply. The present invention, however, is not limited to the above embodiments.

Figure 9:
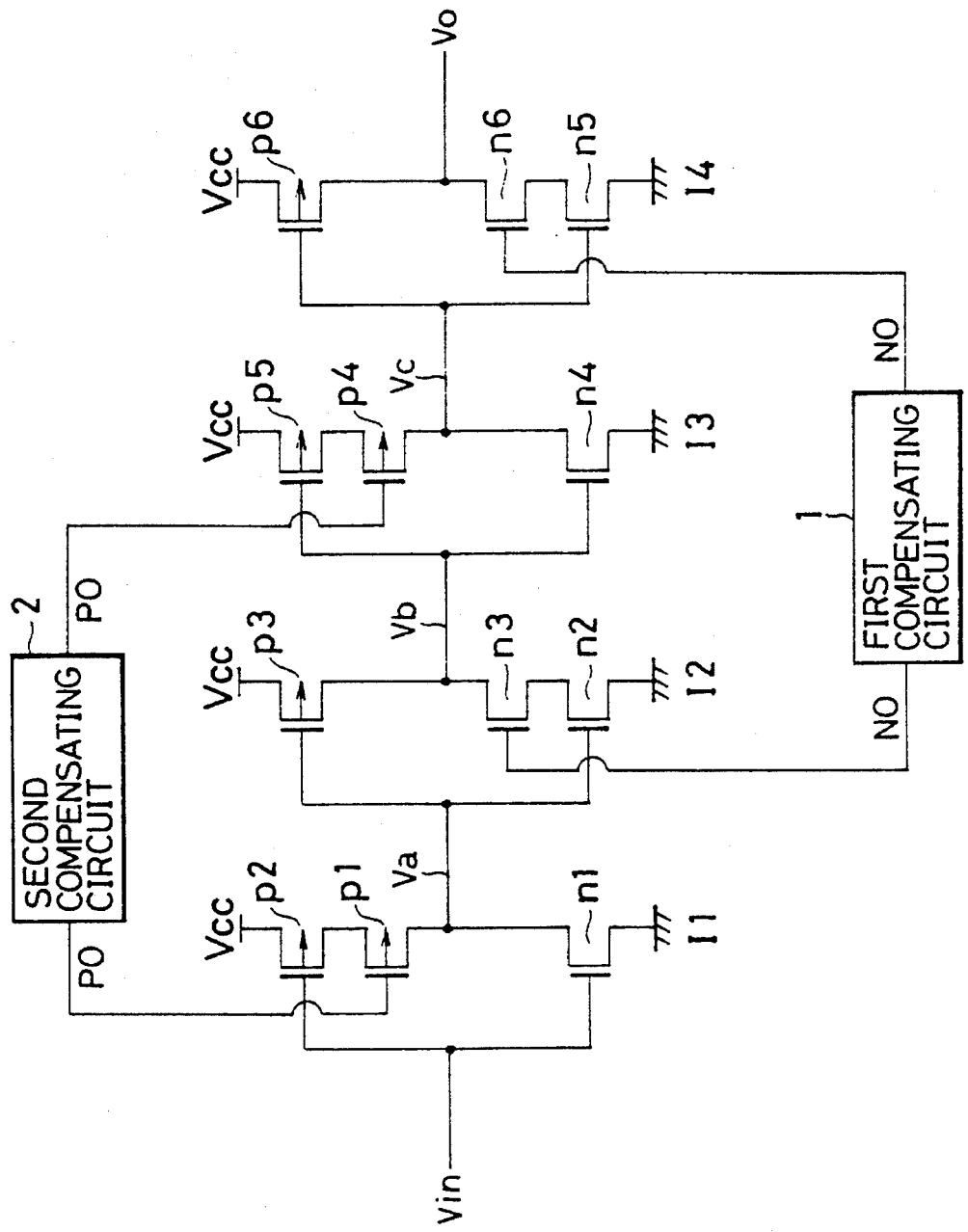
FIG. 9 is a circuit diagram to show a modification of the delay circuit shown in FIG. 1.
Figure 10:
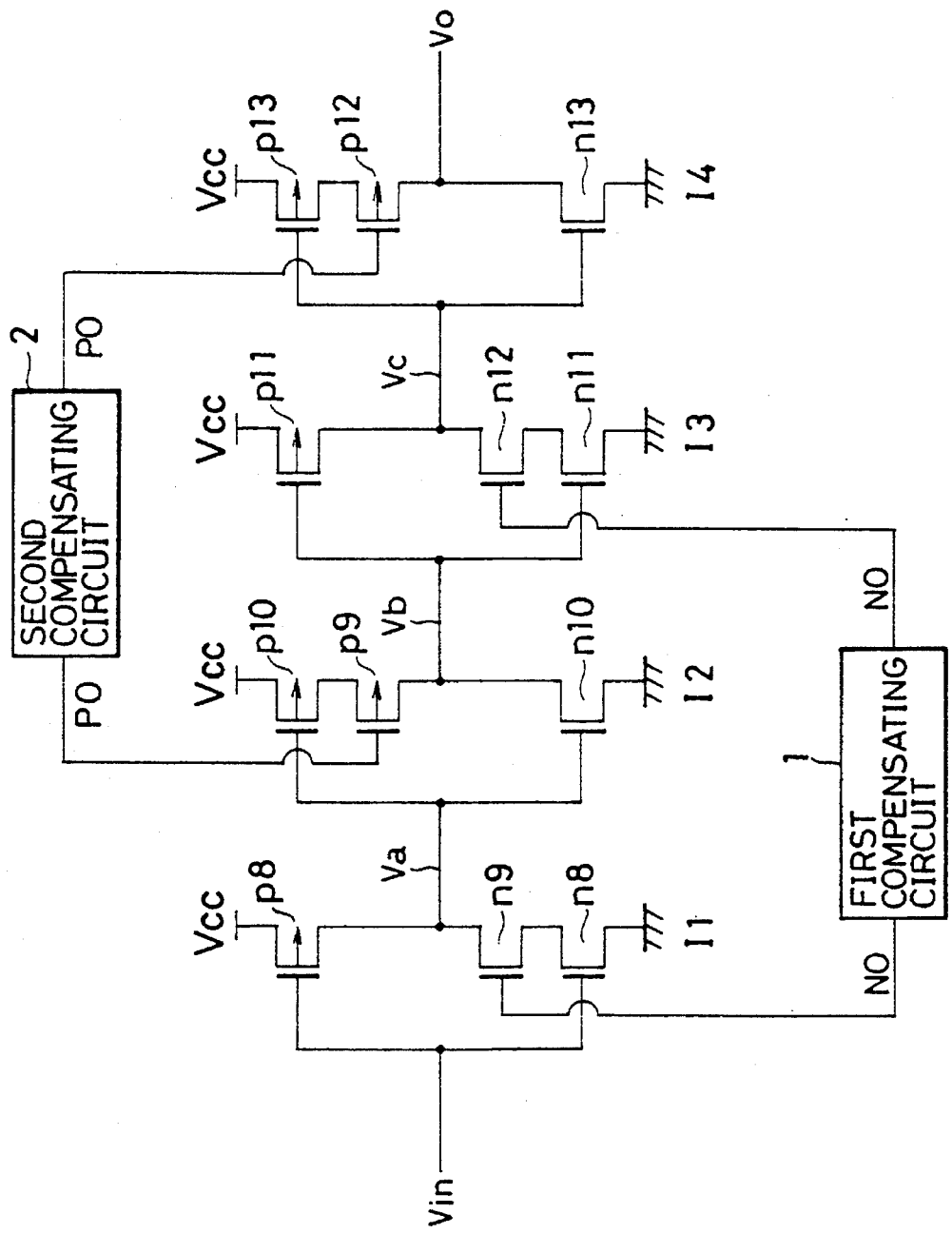
FIG. 10 is a circuit diagram to show a modification of the delay circuit shown in FIG. 7.
Figure 11:
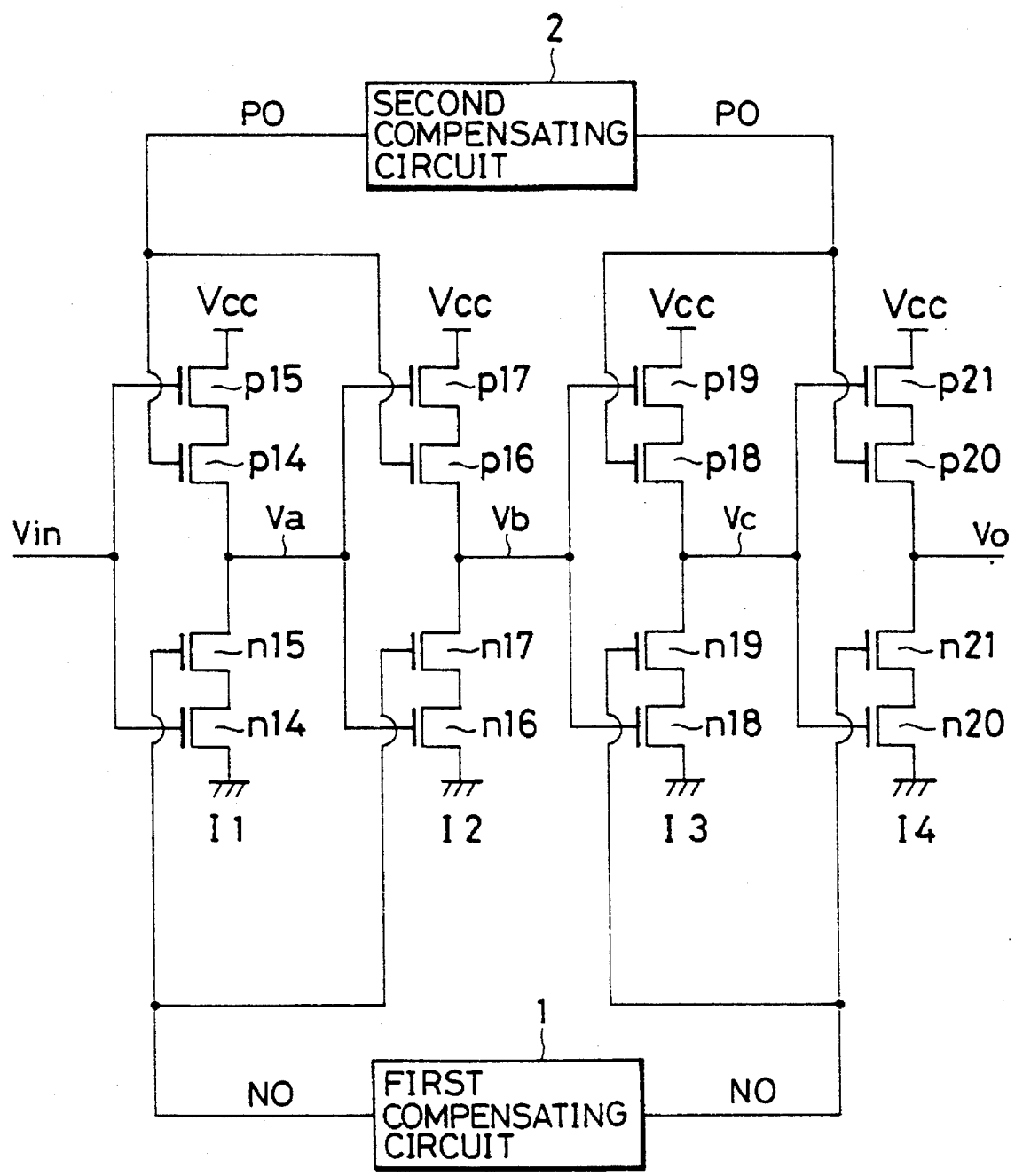
FIG. 11 is a circuit diagram to show a modification of the delay circuit shown in FIG. 8.

For example, such embodiments may be obtained that each additional NMOS transistor receiving the output signal from the first compensating circuit 1 is connected in series between the drain of NMOS transistor in the ordinary inverter circuit and the output node in the inverter circuit and that each additional PMOS transistor receiving the output signal from the second compensating circuit 2 is connected in series between the drain of PMOS transistor in the ordinary inverter circuit and the output node in the inverter circuit. FIG. 9, FIG. 10, FIG. 11 show the so-arranged embodiments corresponding to FIG. 1, FIG. 7 and FIG. 8, respectively. The difference is only the locations of additional NMOS transistors and additional PMOS transistors. Either one delay circuit in the embodiments can also obtain an almost constant delay time even with variations in MOS transistor characteristic (Vth) and in ambient temperature.

As described above, the present invention can provide a delay circuit which can keep the delay time constant even with variations in process parameter and in temperature.

Many widely different embodiments of the present invention may be constructed without departing from the spirit and scope of the present invention. It should be understood that the present invention is not limited to the specific embodiments described in the specification, except as defined in the appended claims.

What is claimed is:

1. A delay circuit comprising:

a first modified inverter circuit comprising a CMOS inverter and a first additional NMOS transistor, said CMOS inverter having an NMOS transistor and a PMOS transistor connected in complementary connection between a positive power supply and the ground, said first additional NMOS transistor being connected between the source of the NMOS transistor in the first modified inverter circuit and the ground for controlling a current from said first modified inverter circuit to the ground;

a first compensating circuit connected to a gate of said additional NMOS transistor and providing to said gate an output signal for compensating a change in characteristic of the first additional NMOS transistor, wherein said first compensating circuit comprises a second NMOS transistor and a resistor, said resistor being connected to the positive power supply at one end and to the drain of said second NMOS transistor at the other end, a source of said second NMOS transistor being connected to the ground, and a gate signal of said second NMOS transistor being a power-supply voltage in operation and the ground in stand-by, wherein said first compensating circuit outputs the output signal from a connection point between said second NMOS transistor and said resistor;

the output signal of said first compensating circuit increasing with an increase in NMOS transistor threshold value (Vtn) or with an increase in ambient temperature;

a second modified inverter circuit comprising a CMOS inverter and a first additional PMOS transistor, said CMOS inverter having an NMOS transistor and a PMOS transistor connected in complementary connection between a positive power supply and the ground, said first additional PMOS transistor being connected between the source of the PMOS transistor in the second modified inverter circuit and the positive power supply for controlling a current from said second modified inverter circuit to the positive power supply; and a second compensating circuit connected to a gate of said first additional PMOS transistor and providing to said gate an output signal for compensating a change in characteristic of said additional PMOS transistor, wherein said second compensating circuit comprises a second PMOS transistor and a resistor, said resistor being connected to the ground at one end and to a drain of said second PMOS transistor at the other end, a source of said second PMOS transistor being connected to the positive power supply, and a gate signal of said second PMOS transistor being the ground in operation and a power supply voltage in stand-by, wherein said second compensating circuit outputs the output signal from a connection point between said second PMOS transistor and said resistor;

the output signal of said second compensating circuit decreasing with an increase in PMOS transistor threshold (Vtp) or with an increase in ambient temperature;

wherein said first modified inverter circuit and said second modified inverter circuit are connected to each other so as to provide an output signal from the delay circuit which is delayed with respect to an input signal input into the delay circuit.

2. A delay circuit according to claim 1, wherein said second modified inverter circuit receives the input signal into the delay circuit and said first modified inverter circuit outputs the output signal from the delay circuit.

3. A delay circuit according to claim 1, wherein said first modified inverter circuit receives the input signal into the delay circuit and said second modified inverter circuit outputs the output signal from the delay circuit.

4. A delay circuit according to claim 1, comprising a plurality of the first modified inverter circuits and a plurality of the second modified inverter circuits, which are alternately connected to each other.

5. A delay circuit according to claim 4, wherein said first modified inverter circuits are arranged in odd stages and the second modified inverter circuits in even stages with respect to an input terminal of the delay circuit.

6. A delay circuit according to claim 4, wherein said second modified inverter circuits are arranged in odd stages and the first modified inverter circuits in even stages with respect to an input terminal of the delay circuit.

7. A delay circuit according to claim 1, wherein said first modified inverter circuit further comprises a second additional PMOS transistor for controlling a current from said first modified inverter circuit to the positive power source, said second additional PMOS transistor being connected between the positive power supply and a source of said PMOS transistor of said first modified inverter and a gate of said additional PMOS transistor being connected to said second compensating circuit to receive an output signal therefore; and wherein said second modified inverter circuit further comprises a second additional NMOS transistor for controlling a current from said second modified inverter circuit to the ground, said second additional NMOS transistor being connected between a source of said NMOS transistor of said second modified inverter and the ground and a gate of said second additional NMOS transistor being connected to said first compensating circuit to receive an output signal therefrom.

8. A delay circuit according to claim 1, wherein said first compensating circuit provides an output signal for compensating a change in characteristic of the first additional NMOS transistor in the first modified inverter circuit due to a change in process parameter; and wherein said second compensating circuit provides an output signal for compensating a change in characteristic of the first additional PMOS transistor in the second modified inverter circuit due to the change in process parameter.

9. A delay circuit according to claim 1, wherein said first compensating circuit provides an output signal for compensating a change in characteristic of the first additional NMOS transistor in the first modified inverter circuit due to a change in temperature; and wherein said second compensating circuit provides an output signal for compensating a change in characteristic of the first additional PMOS transistor in the second modified inverter circuit due to the change in temperature.

10. A delay circuit according to claim 1, wherein said characteristic of the first additional NMOS transistor and said characteristic of the first additional PMOS transistor each are on-impedance.

11. A delay circuit according to claim 1, wherein said first compensating circuit is designed in such a manner that a decrease in on-impedance of said first modified inverter due to a lowered threshold value (Vtn) is cancelled by an increase in on-impedance of said first additional NMOS transistor due to reduction in the output signal of said first compensating circuit when said threshold value of said NMOS transistor is smaller than a standard value or ambient temperature is lower than a standard temperature and that delay time of said first modified inverter is kept substantially unchanged.

12. A delay circuit according to claim 1, wherein said first compensating circuit is designed in such a manner that an increase in on-impedance of said first modified inverter due to a increased threshold value (Vtn) is cancelled by a decrease in on-impedance of said first additional NMOS transistor due to an increase in the output signal of said first compensating circuit when said threshold value of said NMOS transistor is greater than a standard value or ambient temperature is higher than a standard temperature and that delay time of said first modified inverter is kept substantially unchanged.

13. A delay circuit according to claim 1, wherein said second compensating circuit is designed in such a manner that a decrease in on-impedance of said second modified inverter due to a lowered threshold value (Vtp) is cancelled by an increase in on-impedance of said first additional PMOS transistor due to an increase in the output signal of said second compensating circuit when said threshold value of said PMOS transistor is smaller than a standard value or ambient temperature is lower than a standard temperature and that delay time of said second modified inverter is kept substantially unchanged.

14. A delay circuit according to claim 1, wherein said second compensating circuit is designed in such a manner that an increase in on-impedance of said second modified inverter due to an increased threshold value (Vtp) is cancelled by a decrease in on-impedance of said first additional PMOS transistor due to a decrease in the output signal of said second compensating circuit when said threshold value of said PMOS transistor is greater than a standard value or ambient temperature is greater than a standard temperature and that delay time of said second modified inverter is kept substantially unchanged.

15. A delay circuit according to claim 1, wherein said gate signal of said second NMOS transistor of said first compensating circuit is a chip enable signal (CE).

16. A delay circuit according to claim 1, wherein said gate signal of said second PMOS transistor of said second compensating circuit is a chip enable signal (CE).

* * * * *

UNITED STATES PATENT AND TRADEMARK OFFICE
CERTIFICATE OF CORRECTION

PATENT NO. : 5,453,709
DATED : September 26, 1995
INVENTOR(S) : Junichi TANIMOTO and Toshiji ISHII It is certified that error appears in the above-indentified patent and that said Letters Patent is hereby corrected as shown below:

On title page, item [73] change "Shabushiki" to --Kabushiki--.

Signed and Sealed this

Twenty-first Day of May, 1996

Attest:

BRUCE LEHMAN

*Attesting Officer*     *Commissioner of Patents and Trademarks*